June 8, 1965 A. C. REID 3,188,554

ATTENUATION NETWORK

Filed June 13, 1961

INVENTOR.
ALBERT C. REID

BY
Adams, Forward and McLean
ATTORNEYS 3,188,554
Patented June 8, 1965

3,188,554

ATTENUATION NETWORK

Albert C. Reid, Tulsa, Okla., assignor, by mesne assignments, to Sinclair Research, Inc., New York, N.Y., a corporation of Delaware Filed June 13, 1961, Ser. No. 126,757
3 Claims. (Cl. 323—74)

Figure 1:
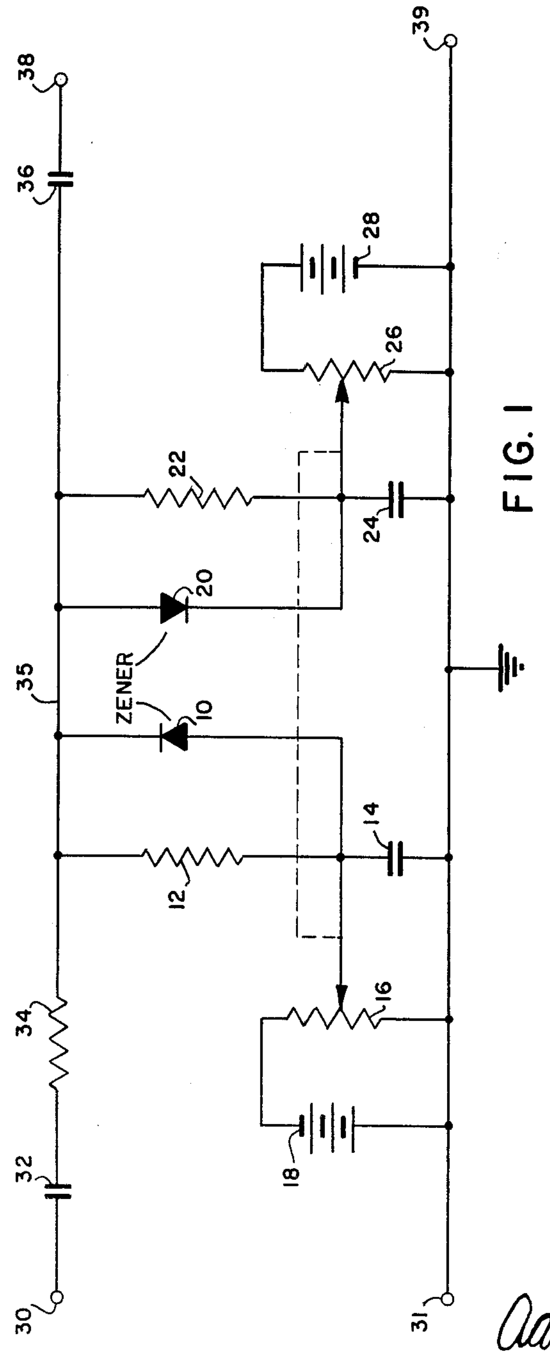

My invention relates to electric signal attenuation. More particularly, my invention provides a linear attenuation network including a back-to-back diode shunt, having a pair of p-n junction diodes (as defined in U.S. Patent No. 2,854,651 to Kircher and hereinafter referred to as "Zener diodes") connected in parallel relationship with reverse polarity and biased to a negative potential less than the Zener potential.

Signal attenuation by means of biased and unbiased diodes connected in reverse polarity in both parallel and series relationship is well known to those skilled in the art. Moreover, semiconductor diodes connected in reverse, parallel relationship with negative bias have been used for on-off switching circuits responsive to a minimum potential thereacross. Unbiased Zener diodes connected in series opposing or back-to-back relationship have been used for the same purpose. Semiconductive diodes having reverse quadrant, voltage current characteristics somewhat similar to the breakdown characteristics of arc discharge gas tubes have been connected in back-to-back relationship with standard diodes for purposes of voltage regulation.

In connection with attenuation networks, a well known use of diodes has been to obtain non-linear attenuation of signals having a broad range of magnitudes. This is desirable when volume compression of signals is needed. Unbiased copper oxide rectifiers, vacuum tube diodes, crystal diodes, standard semiconductors and the like have been used for this purpose.

So far as I am aware, however, there has not heretofore been available a diode attenuation circuit providing linear attenuation of a given signal which can be adjusted to provide a wide range of permissible attenuation factors.

I have discovered that carefully matched Zener diodes negatively biased to the region below the Zener potential and connected in parallel with reverse polarity relationship, for small amplitude signals in the millivolt range up to close to one volt exhibit substantially linear attenuation characteristics. The choice of the biasing potential and the series input impedance determines the amount of attenuation produced for a given pair of diodes. Within the range of a few volts change of bias, a broad range of attenuation factors is available, yet for any given bias potential, small amplitude signals will be attenuated in a substantially linear manner. The Zener diode impedance for such biasing can be adjusted between resistances in the ohm range and the megohm range. Thus a simple, compact, efficient, and broad range attenuator is embodied in the present invention.

Thus, in accordance with my invention, I provide an attenuation network for low amplitude input signals, in which ends of opposite polarity of two matched Zener diodes are each connected to a common terminal, preferably each being shunted by one of a pair of matching resistors. The opposite end of each diode is connected to a D.C. biasing source which typically includes a variable potentiometer in parallel with a D.C. source or is an automatic gain control potential, which biases the diode with a reverse potential, and is connected to a common reference point, e.g., ground potential, through a separate capacitor. The diodes are negatively biased to operate within the range on the voltage-current characteristic curve between a slightly negative potential and the negative Zener potential in the region where resistance of the individual diodes has been found to be approximately an inverse exponential function of the negative potential.

Figure 2:
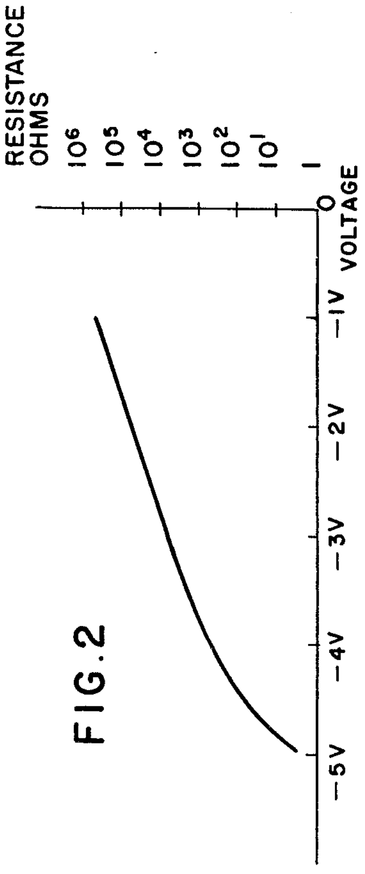

For a more complete understanding of my invention, reference is made to the drawings in which:

FIGURE 1 is an electrical schematic diagram of an attenuation network in accordance with my invention; and FIGURE 2 is a graph of resistance as a function of biasing voltage for a Zener diode negatively biased in accordance with my invention.

Referring to FIGURE 1, the reference numerals 10 and 20 denote a pair of matching Zener diodes which are connected in an attenuation network having a pair of input terminals 30 and 31 and having a pair of output terminals 38 and 39. Terminals 30 and 38 are interconnected through an input coupling capacitor 32, a resistor 34, a terminal 35 (shown as a line in the drawing) and an output coupling capacitor 36 connected respectively in series, while terminals 31 and 39 are each grounded.

The negative side (n-type electrode) of diode 10 and the positive side (p-type electrode) of diode 20 are commonly connected to terminal 35, while the positive side of diode 10 is connected to ground through an A.C. shunt capacitor 14 and the negative side of diode 20 is connected to ground through an A.C. shunt capacitor 24. A battery 18 having its positive side grounded is connected in parallel with a potentiometer 16 having its wiper contact connected to the positive side of diode 10, and a battery 28 having its negative terminal grounded is connected in parallel with a potentiometer 26 having its wiper contact connected to the negative side of diode 20. A pair of matching resistors 12 and 22 are connected in series with their common connection tied to terminal 35 and their remote ends connected to the wiper contacts of potentiometers 16 and 26 respectively, thus stabilizing the negative biasing of each of diodes 10 and 20, and effectively placing a limit on the maximum impedance of the attenuator. In operation the settings of the wiper contacts 16 and 26 are adjusted such that the biasing D.C. potential across diodes 10 and 20 is in the negative non-conducting region, that is between zero and Zener potentials, while the network is connected between stages in an amplifier, for example, a seismic amplifier, by connecting terminals 30 and 31 to the output of one stage of the amplifier and terminals 38 and 39 to the input of the next succeeding stage of the amplifier.

Referring to FIGURE 2, which shows the resistance versus voltage characteristics of a typical Zener diode, it will be noted that in the negative quadrant, as indicated above, between a voltage slightly below zero and slightly above the Zener potential (minus 5 volts in the illustrated case) the resistance of the diode varies on the order of $10^6$ and is an inverse exponential function of the absolute value of the applied voltage. With diodes having the characteristic shown in FIGUURE 2, proper operation would be obtained with biasing of each diode between about minus 1 and about minus 4 volts. It will be observed, however, that between those potentials widely varying attenuation factors can be achieved. It will also be apparent that because of the balanced condition of the circuit, utilizing matched diodes and matched resistors 12 and 22, substantially linear attenuation is achieved because of the back-to-back relationship of the diodes despite the non-linear resistance-voltage characteristic. Generally, however, amplitude peaks of more than one volt cannot be tolerated where distortion in a non-linear manner must be avoided.

In a typical circuit the following parts had the noted values:

| Capacitors: | Microfarads |
|---|---|
| 14 | 15 |
| 24 | 15 |
| 32 | .15 |
| 36 | .1 |

| Resistors: | Ohms |
|---|---|
| 12 | megs__ 2 |
| 22 | do___ 2 |
| 34 | do___ 1 |

| Diodes: | |
|---|---|
| 10 | 651C4 |
| 20 | 651C4 |

The noted diodes have a Zener pottential of —4.9 volts. When the applied negative biasing on each of diodes 10 and 20 was minus 3.1 volts, signal attenuation of 34 decibels was achieved utilizing a signal having a frequency in the range of 10 to 200 c.p.s. and having a maximum amplitude of 200 millivolts without noticeable distortion.

I claim:

1. An attenuation network including a pair of Zener diodes, one said diode having an electrode thereof connected to the electrode of opposite polarity of the other said diode, D.C. bias means connected to the other electrode of each said diode whereby the applied voltage on each said diode is in the negative non-conducting region between zero potential and the Zener potential, a pair of capacitive means serially interconnected between said other electrodes of said pair of diodes, input circuit means coupled to the common connection of said first named electrodes of said diodes and to the common connection of said capacitive means for applying an A.C. signal across said diodes, and output circuit means coupled to said common connection of said first named electrodes of said diodes and to the common connection of said capactive means.

2. An attenuation network including a pair of matched Zener diodes, the positive electrode of one said diode being connected to the negative electrode of the other said diode, D.C. bias means connected to the negative electrode of said first named diode to apply a positive voltage thereto and connected to the positive electrode of said second named diode to apply a negative voltage thereto equal in magnitude to said positive voltage, whereby the applied voltage on each said diode is in the negative non-conducting region between zero potential and the Zener potential, a pair of capacitors serially interconnected between the negative electrode of said first diode and the positive electrode of said second diode, input circuit means coupled to the connection of said positive electrode of said first named diode and the negative electrode of said second named diode and to the common connection of said capacitors for applying an A.C. signal across said diodes, and output circuit means coupled to said common connection of said positive electrode of said first named diode and said negative electrode of said second named diode and to the common connection of said capacitors.

3. A network according to claim 2 which further includes a pair of matched resistors, one said resistor being connected between the electrodes of said first named diode and the other resistor being connected between the electrodes of said second named diode.

References Cited by the Examiner

UNITED STATES PATENTS

| | | | |
|---|---|---|---|
| 2,842,625 | 7/58 | Holmes | 333—81 |
| 2,876,366 | 3/59 | Hussey | 307—88.5 |
| 2,983,863 | 5/61 | Keonjian | 323—79 |
| 3,037,129 | 5/62 | LeBel | 307—88.5 |

LLOYD McCOLLUM, *Primary Examiner.*

MILTON O. HIRSHFIELD, *Examiner.*